(12) United States Patent
Hsu et al.

(10) Patent No.: US 8,916,032 B2
(45) Date of Patent: Dec. 23, 2014

(54) LIGHT EMITTING DIODE VACUUM COATING BY MAGNETIZED MASK

(76) Inventors: Roger Wen Yi Hsu, Rancho Cucamonga, CA (US); Shu-Yu Hsu, Chang-Hwa (TW); Shu-His Hsu, Chang-Hwa (TW)

( * ) Notice: Subject to any disclaimer, the term of this patent is extended or adjusted under 35 U.S.C. 154(b) by 951 days.

(21) Appl. No.: 12/055,067

(22) Filed: Mar. 25, 2008

(65) Prior Publication Data
US 2009/0084670 A1 Apr. 2, 2009

Related U.S. Application Data

(60) Provisional application No. 60/997,424, filed on Oct. 2, 2007.

(51) Int. Cl.
| | |
|---|---|
| C23C 14/00 | (2006.01) |
| F21K 99/00 | (2010.01) |
| C23C 14/04 | (2006.01) |
| H01L 33/60 | (2010.01) |

(52) U.S. Cl.
CPC ............... F21K 9/00 (2013.01); C23C 14/042 (2013.01); H01L 33/60 (2013.01)
USPC .............. 204/192.27; 438/282; 204/298.11; 204/192.12; 118/503; 118/504; 118/505; 118/720; 118/721

(58) Field of Classification Search
USPC .......... 204/192.12, 192.27, 298.11; 118/503, 118/504, 505, 720, 721; 438/282
See application file for complete search history.

(56) References Cited

U.S. PATENT DOCUMENTS

| | | | | |
|---|---|---|---|---|
| 5,045,344 | A * | 9/1991 | Pinkhasov | 427/580 |
| 5,589,280 | A * | 12/1996 | Gibbons et al. | 428/626 |
| 5,752,139 | A * | 5/1998 | Sumikawa et al. | 399/264 |
| 6,406,988 | B1 * | 6/2002 | Chung | 438/612 |
| 6,774,405 | B2 * | 8/2004 | Yasukawa et al. | 257/99 |
| 6,858,086 | B2 * | 2/2005 | Kang | 118/720 |
| 2005/0066897 | A1 * | 3/2005 | Pelhos et al. | 118/721 |

* cited by examiner

Primary Examiner — John Brayton
(74) Attorney, Agent, or Firm — Alexander Chen, Esq.

(57) ABSTRACT

The present invention discloses an improved method of LED reflector manufacturing process where the method includes providing a substrate, wherein said substrate comprises a reflector unit, and a Light Emitting Diode; providing a shield member with ferromagnetic property; placing said shield member over the desired area of over the substrate; providing a magnet where said shield member is attracted to; placing said magnet immediately below the substrate wherein said magnet is capable of immobilizing the shield member over the substrate; performing a vacuum deposition coating; and removing the magnet and the shield member.

15 Claims, 8 Drawing Sheets

LIGHT EMITTING DIODE VACUUM COATING BY MAGNETIZED MASK

CROSS REFERENCE TO RELATED APPLICATION

This application claims the benefit of priority under 35 U.S.C. 119(e) to the filing date of U.S. provisional patent application No. 60/997,424 entitled "Light Emitting Diode Vacuum Coating by Magnetized Mask" which was filed Oct. 2, 2007, and is incorporated herein by reference.

FIELD OF INVENTION

This present invention relates to methods for vacuum coating. Specifically, it is an improved method to perform vacuum coating. More specifically, it is a method of vacuum coating as used to coat the reflection unit as the reflection unit is used in connection with light emitting diode (LED) chip.

BACKGROUND OF THE INVENTION

In the past, LED was used as signal(s), instead of being utilized as a lighting source (e.g. flashlights). Recent technological advancements enable LED (Light Emitting Diode) to have better reflection. In general, LED (light emitting device) uses reflection to guide light into a direction. The reflection of light is made by the surrounding/cover material to push light in certain direction(s). The quality of the reflection would be dependent on the shape of the surrounding. Such surrounding is collective referred as reflection unit.

Today, LED and the reflection surrounding (reflection unit) can be made separately or together. The reflection unit is generally made of plastic material. To achieve reflection capability, the unit is either formed by mixing $TiO_2$ powder or other power with reflective property as such powders maintain certain reflective qualities or the reflection unit made of plastic material is coated with metal thin film such as aluminum and silver thin film. The layers may be as thin as several atoms and the thickness is generally less than one micron. It is well known in the art that such aluminum and silver thin film generate the most efficient reflection power.

There are two processes present in which one can use to plate the reflection unit. One is coating by electrical plating and the other is coating by vacuum coating. Electrical plating is not desirable in that the liquid is likely to sip into the crevice of the cover. This is true because in electrical plating, one will need to have all the crevices covered, and it is often difficult to do so. Therefore, vacuum coating process is preferred over electrical plating.

Specifically, vacuum coating is a process used to create a thin layer of a substance on a solid object. The object is placed into a vacuum chamber and a small amount of the coating material is vaporized into the chamber. The molecules or atoms of vapor condense onto the solid object, forming a uniform coating of controllable thickness.

Nevertheless, this vacuum coating process, especially as used in the context of coating the LED reflection unit, is in need of improvement. Specifically, in order to plate the area that needs to be not coated with metal thin film (non-coating area) in a vacuum plating process, one would need to cover the area that does not need to be coated. Thus, the quality of the cover plating or shield and how it is secured over the non-intended coating area will determine the quality of the coating.

Traditionally, the cover plate (shield) is held over the non-coating area by pressing the cover plate (shield) over the non-coating area with an external application. This method is not desirable. Specifically, this use of external application such as clip to secure the cover plate (shield) is also not desirable because such external application will have to be designed to avoid blocking the intended coating area as metal thin film deposes over the intended coating area and clip may inadvertently block the intended coating area. Further, because the size of the cover plate is now becoming increasingly small, the strength of the clips would need to be uniform or else the structure of the cover plate will be distorted.

As a result, it is desired that a method of vacuum deposition is available where cover plate (shield) can be held in place during vacuum deposition process without the presence of clips or clamps. Specifically, it is left to desire an improved method of vacuum deposition for coating the reflection unit of a light emitting diode (LED) chip substrate where the cover plate (shield) can be held in during vacuum deposition process without the presence of clips or clamps.

SUMMARY DESCRIPTION OF THE INVENTION

Figure 1:
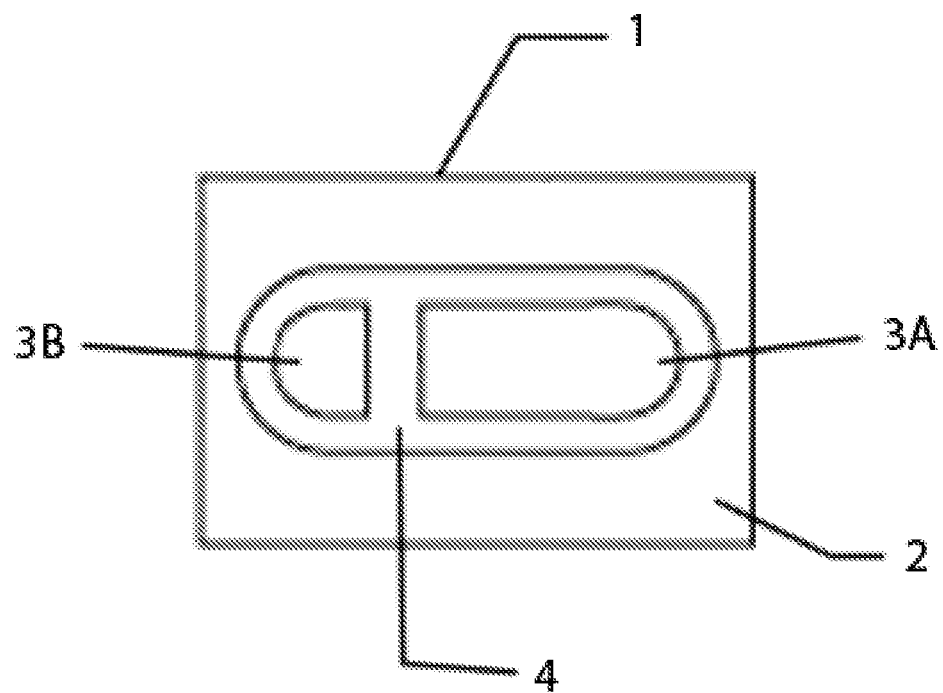
FIG. 1 is a top view of an LED chip substrate incorporating the reflection unit with lead frame molded in insulation material.

The present invention discloses an improved method of LED reflector manufacturing process where the method includes 1) providing a substrate, wherein said substrate comprises a reflector unit, and a Light Emitting Diode, 2) providing a shield member with ferromagnetic property, 3) placing said shield member over the desired area of over the substrate, 4) providing a magnet where said shield member is attracted to, 5) placing said magnet immediately below the substrate wherein said magnet is capable of immobilizing the shield member over the substrate, 5) performing a vacuum deposition coating; 6) and removing the magnet and the shield member.

In one embodiment, the vacuum deposition coating process includes depositing at least one layer of metal coating on the reflector unit. In another embodiment, the vacuum deposition coating process includes first depositing a layer of smoother on the reflector unit, and then depositing a layer of metal coating on the reflector unit so that the layer smoother can smooth the layer of metal on the reflector unit. Here, the smoother layer can be either a layer of primer or a layer of paint.

In yet another embodiment, the vacuum deposition coating of present invention includes first depositing a layer of smoother on the reflector unit, and then depositing a layer of metal coating on the reflector unit so that the layer smoother can smooth the layer of metal on the reflector unit and lastly depositing a layer of solid coat to prevent oxidation of the metal coating. Here the solid coat can be a layer of clear coat.

In one other embodiment the shape of the shield can be adjusted to fit said reflector. Likewise, the shape of said magnet can be adjusted to fit to the substrate. In a preferred embodiment, the thickness of the shield can be adjusted so the thickness of the shield can control the shading of surrounding metal coating deposition. In yet another preferred embodiment, the thickness, and shape of said shield can be adjusted depending on desired effect of the metal coating deposition. The material for the metal layer can be silver, or aluminum.

Yet another aspect of present invention discloses an improved method of vacuum deposition process which includes: first providing a substrate; then providing a shield member with ferromagnetic property; then placing said shield member over the desired area of over the substrate; then providing a magnet where said shield member is attracted to; then placing said magnet immediately below the substrate wherein said magnet is capable of immobilizing the shield member over the substrate; then performing a vacuum deposition coating process; and then removing the magnet and the shield member.

In one embodiment, the shape of said shield can be adjusted to fit the shape of the substrate. In yet another embodiment, the shape of said shield can be adjusted based on the desired area to be covered by the shield. Likewise, the shape of said magnet can be adjusted to fit to the substrate. Further, the shape of said magnet can be adjusted based on the size of the shield. In a preferred embodiment, the said vacuum deposition coating process comprises depositing a layer of desired material over the substrate.

DETAILED DESCRIPTION OF THE INVENTION

In the present invention, cover plate (shield) exhibiting ferromagnetic property can be manufactured by compressing then die cut, by complete straight die cut, by injection-mold the cover plate to desirable size and shape, or by sheet metal press technology. Cover plate can be manufactured in shape to control the direction, shape, area, geometry, and concentration of the reflection. The cover plate can be made very small, from as small as 1 mm in area and above. The vacuum coating depositing process will utilize aluminum and silver thin film, or other reflecting materials, to coat the reflection unit in order to achieve maximum reflection rate. The cover plate is placed over the substrate.

Next a proprietary magnetic holding device, a device such as magnet, is used to hold the cover plate to its place during vacuum coating. Specifically, since the cover plate is made of metal, a material with ferromagnetic property, it is attracted to the magnet where the magnet is placed underneath the substrate and thus is secured by it being attracted to the magnet placed on the opposite side of the substrate.

In another approach, the cover plate is manufactured with magnetized powder and thus is also secured as it is being attracted to the metal plate exhibiting ferromagnetic property placed on the opposite side of the reflection unit. Accordingly, this method of securing covering plates can be applied to cover plates made of metal or cover plate made with plastic mixed with metal powder or cover plate made with plastic mixed with magnetized powder.

Specifically, if the cover plate is made of metal, an appropriate magnet will be applied on the opposite site of the substrate as the magnet attracts the metal cover plate and secure the metal cover plate to its place. Likewise, the same principal applies if the cover plate is made of plastic but mixed with metal powder. In such scenario, the plastic cover plate made with mix metal powder still exhibits ferromagnetic property and thus will also be attracted to the magnet placed on the opposite site of the substrate and thus can be secured to its intended place.

Further, if the cover plate is made of plastic material but mixed with magnetized powder, then a metal plate exhibiting ferromagnetic property can be placed on the opposite side of the reflection unit as such metal plate with ferromagnetic property will attract the plastic cover plate made with mixed magnetized powder and secure the plastic cover plate to its intended place.

The benefit to using such magnetized mechanism is that it will be easy to maneuver the cover plate to its intended place as cover plates are often made with custom shapes and are very difficult to maneuver them to their intended places. Another advantage is that it is also easy to remove the cover plate after the vacuum coating process is complete. This securing mechanism is far superior over the use of clips or clamps as a securing mechanism because clips or clamps can block the coating over the intended coating area.

Finally, because sometimes reflection unit formed by plastic injection results in rough surface on a microscopic scale and thus can reduce illuminating efficiency, primer will be applied to the reflection unit after the cover plate is secured to its intended place and before the deposition of metal layer to ensure that the reflection unit's intended coating surface is smooth as to allow better reflection.

After vacuum coating, we seal the coated surface with adhesive lacquer to prevent the metal object or metal powder coating from oxidation. The cover plate can be made with small handle in order to remove the plate manually, in case the magnet is not removed.

Here in FIG. 1 illustrates a typical top view of an LED chip substrate 1 incorporating the reflection unit 2 with a pair of electrodes 3A 3B for bonding to a LED chip's p-n junction, and insulation material 4 such as PCB (Printed Circuit Board) made with combination of glass fiber mat, nonwoven material and resin or plastics made from injection molding with filler or no filler. Although shown with 2 electrodes only, it can be in any number to be utilized for multi-color application.

Figure 2:
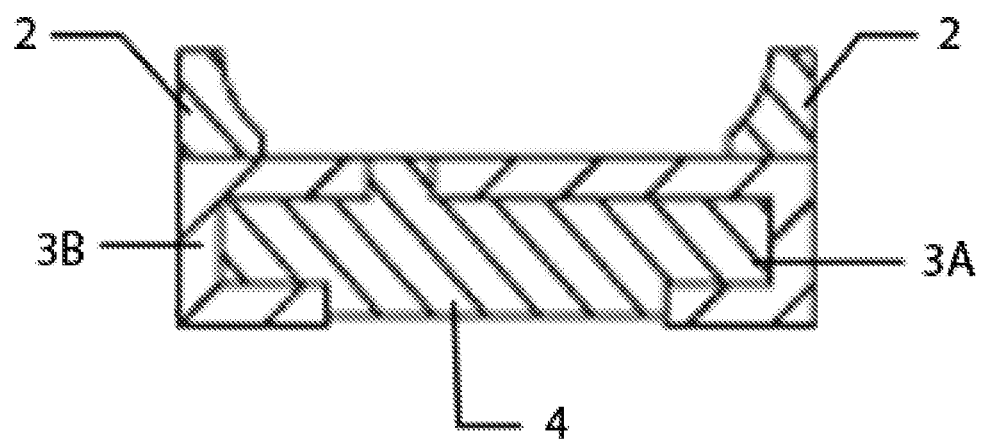
FIG. 2 is a cross section view of FIG. 1.

FIG. 2 is a cross section view of FIG. 1. The figure discloses the reflection unit 2. Also disclosed are the two electrodes 3A and 3B for bonding to a LED chip. The insulation material 4 is also disclosed. It is worth noting that reflector unit does not have to be shaped in oval shape but varies in shape base on the requirement.

Figure 3:
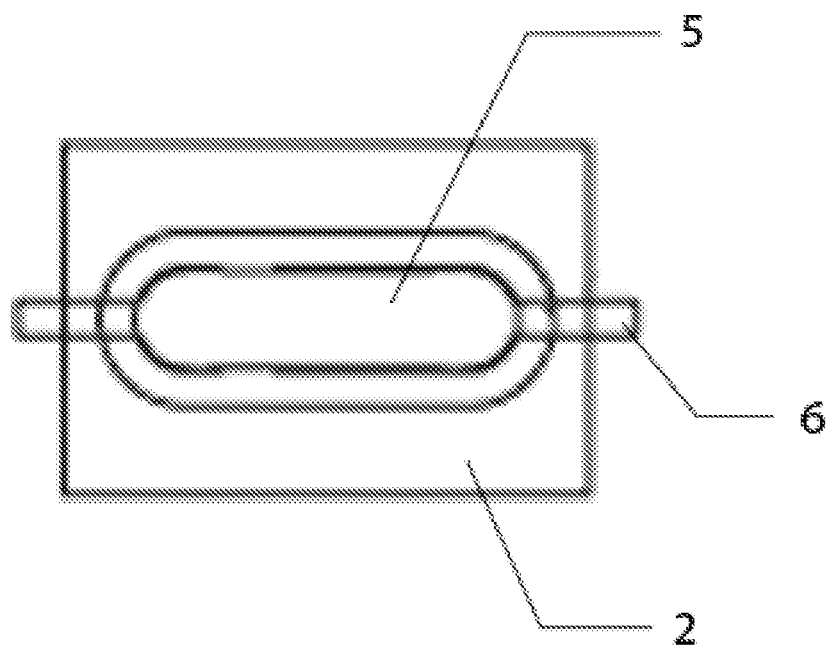
FIG. 3 discloses a top view of a LED chip substrate where the cover plate is secured to its place by the use of clips. From this perspective, it is clear that the clip can interfere with the coating of the reflection unit.

In FIG. 3, the figure discloses a top view of a LED chip substrate 1 where the cover plate (shield) 5 is secured to its place by the use of clips or clamps 6. In this depiction, the cover plate 5 covers the area of the insulation 4, and that of the two electrodes 3A and 3B so that during vacuum deposition coating process, the insulation area 4 is free from accidental coating with metal. From this perspective, it is clear that the clips or clamps 6 can interfere with the vacuum deposition coating of the reflection unit 2.

Figure 4:
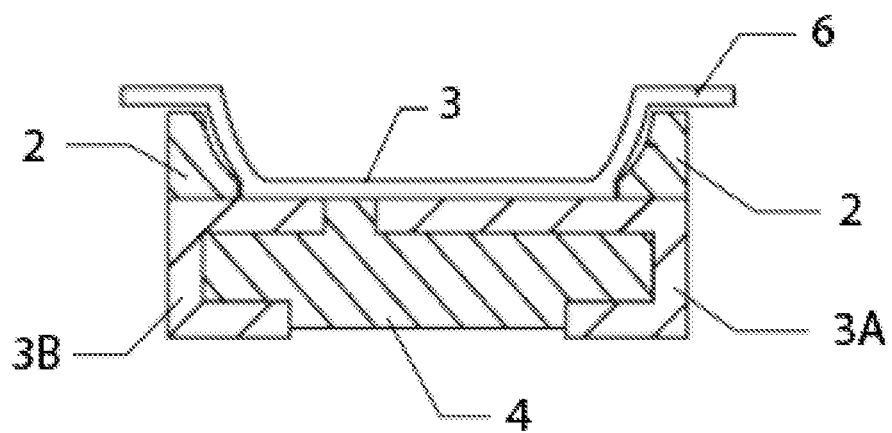
FIG. 4 is a cross section view of FIG. 3.

Depicted in FIG. 4 is a cross section view of FIG. 3 where the clips or clamps 6 are clearly in the way of obstructing vacuum deposition coating of reflector unit 2. Also depicted here is the shield member 5 covering the insulation material 4 and the two electrodes 3A and 3B.

Figure 5:
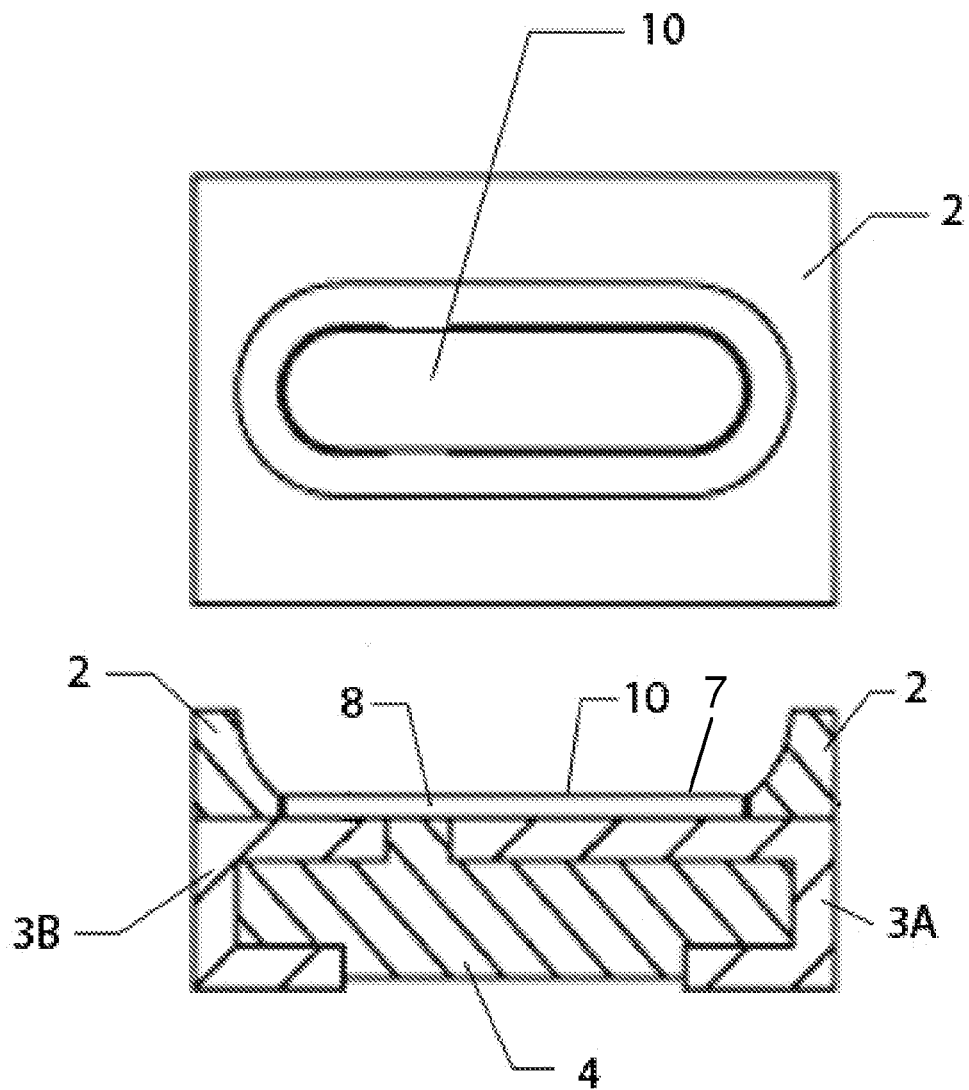
FIG. 5 discloses both the top view and sectional view as to how a cover plate is secured to the LED chip substrate without the use of clips. Here, the magnet is not disclosed.

In accordance with one embodiment of present invention, FIG. 5 discloses both the top view and cross section view of a LED chip substrate 1 with a shield member exhibiting ferromagnetic property 10 covering the insulation material 4 and the two electrodes 3A and 3B. Further, consistent with one of the embodiment of present invention, the cover plate 5 can be changed in its thickness 8 and its shape 7. Here, the magnet 9 is not disclosed. Depending on what the desired result should be, the cover plate can be adjusted by height or by width.

Figure 6:
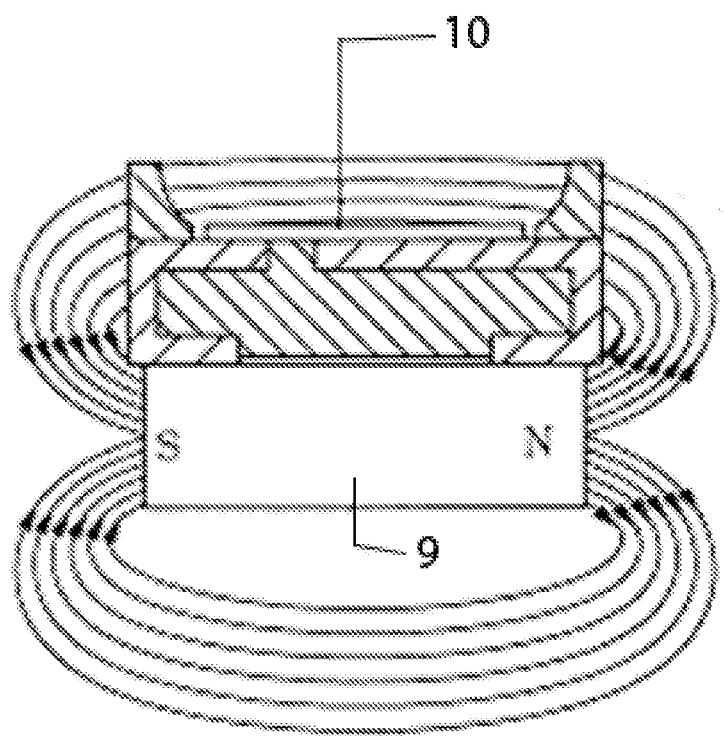
FIG. 6 discloses a cross section view of the LED chip substrate of FIG. 3 with magnet placed at the bottom of the LED case. Here is an illustration of how magnetic vector applies its force on the cover plate. N-S orientation may be swapped or arranged in an angle to secure the cover plate to its place.

Here in FIG. 6, the figure discloses a cross section view of the LED chip substrate 1 of FIG. 5 with magnet 9 placed at the bottom of the LED chip substrate 1. Here is an illustration of how magnetic vector applies its force on the shield member exhibiting ferromagnetic property 5 and secure it firmly to the area over the insulation area 4. N-S orientation may be swapped or arranged in an angle to secure the cover plate to its place.

Figure 7:
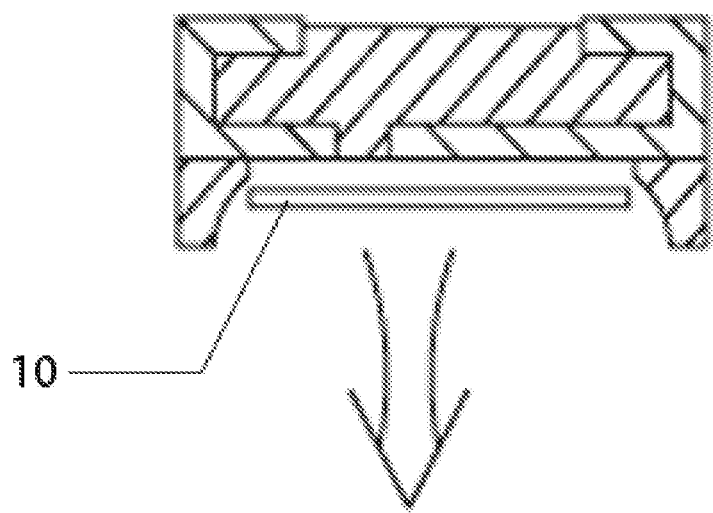
FIG. 7 is a sectional view of the LED chip substrate of FIG. 3 where it illustrates how the cover plate can be released from the LED substrate once the vacuum deposition coating process is completed by the force of gravity or by the force of shock.

In FIG. 7, the figure is a sectional view of the LED chip substrate of FIG. 5 where it illustrates how the shield member exhibiting ferromagnetic property 5 can be released from the LED chip substrate 1, once the vacuum deposition coating process is completed, by the force of gravity or by the force of shock.

Figure 8:
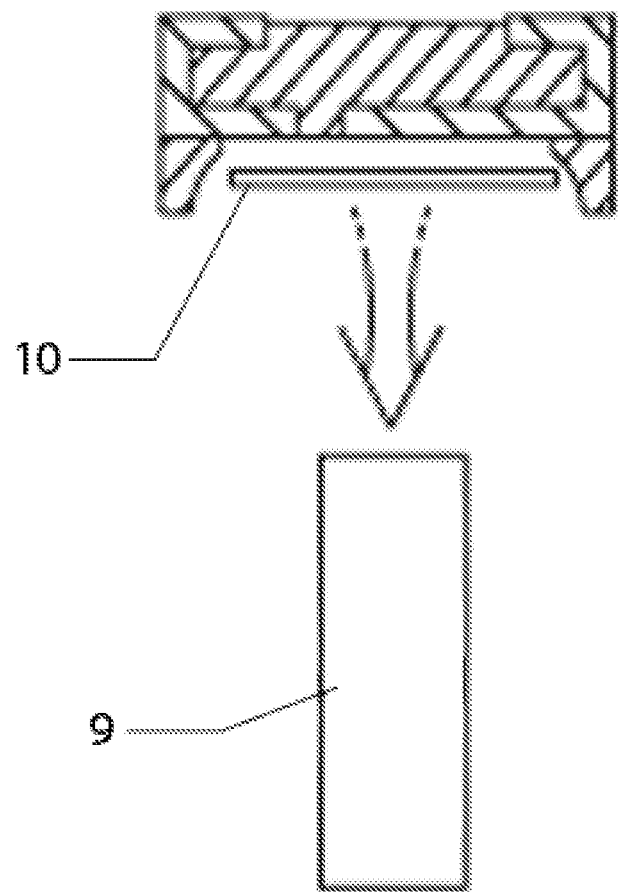
FIG. 8 is a sectional view of the LED substrate of FIG. 3 where it illustrates how the cover plate can be removed by the use of magnet.

Finally, FIG. 8 is a sectional view of the LED chip substrate 1 of FIG. 3 where it illustrates how the shield member exhibiting ferromagnetic property 5 can be removed by the use of magnet 9.

What is claimed is:

1. A method of improving LED reflector manufacturing process, the method comprising: providing a substrate, wherein said substrate comprises a reflector unit, and a Light Emitting Diode; providing a shield member with ferromagnetic property; placing said shield member over said Light Emitting Diode wherein said shield prevents any deposition over said Light Emitting Diode wherein further said reflector unit is left open for deposition over a desired area of said substrate; providing a magnet where said shield member is attracted to; placing said magnet immediately below the substrate wherein said magnet is capable of immobilizing said shield member over said Light Emitting Diode substrate; providing a quantity of metal powder; performing a vacuum deposition coating to coat said reflector unit; and removing said magnet and said shield member.

2. The method of LED reflector manufacturing process of claim 1, wherein said shield member is made in the shape of a plate.

3. The method of LED reflector manufacturing process of claim 1, wherein said shield member is made with a handle for ease of handling.

4. The method of LED reflector manufacturing process of claim 1, wherein said shield member is made with metal material.

5. The method of LED reflector manufacturing process of claim 1, wherein said shield member is made with material of plastic mixed with metal powder.

6. The method of LED reflector manufacturing process of claim 1, wherein said magnet is a metal plate made with material of plastic mixed with magnetized powder.

7. The method of LED reflector manufacturing process of claim 1, wherein said magnet is an electro magnet.

8. The method of LED reflector manufacturing process of claim 1, wherein said vacuum deposition coating comprises first depositing a layer of preparatory coating on the reflector unit, then depositing a layer of metal coating on the reflector unit.

9. The method of LED reflector manufacturing process of claim 8, wherein said preparatory coating is primer or paint.

10. The method of LED reflector manufacturing process of claim 8, wherein said vacuum deposition coating further comprises applying a layer of solid coat to prevent oxidation of the metal coating.

11. The method of LED reflector manufacturing process of claim 10, wherein said solid coat is a clear coat.

12. The method of LED reflector manufacturing process of claim 1, wherein the shape of said shield can be adjusted to fit said reflector.

13. The method of LED reflector manufacturing process of claim 1, wherein the shape of said magnet can be adjusted to fit to the substrate.

14. The method of LED reflector manufacturing process of claim 1, wherein said coating is silver, or aluminum.

15. A method of improving LED reflector manufacturing process, the method comprising: providing a substrate, wherein said substrate comprises a reflector unit, and a Light Emitting Diode; providing a shield member with magnetic property; placing said shield member over said Light Emitting Diode wherein said shield prevents any deposition over said Light Emitting Diode wherein further said reflector unit is left open for deposition over a desired area of said substrate; providing an object with ferromagnetic property where said object is attracted to said shield member; placing said object immediately below the substrate wherein said object is capable of immobilizing the shield member over the Light Emitting Diode substrate; performing a vacuum deposition coating to coat said reflector unit; and removing said object and said shield member.

* * * * *